United States Patent [19]

Ohshima

[11] Patent Number: 4,996,166
[45] Date of Patent: Feb. 26, 1991

[54] PROCESS FOR FABRICATING A HETEROJUNCTION BIPOLAR TRANSISTOR

[75] Inventor: Toshio Ohshima, Atsugi, Japan

[73] Assignee: Fujitsu Limited, Kawasaki, Japan

[21] Appl. No.: 466,646

[22] Filed: Jan. 17, 1990

Related U.S. Application Data

[60] Division of Ser. No. 262,241, Oct. 20, 1988, Pat. No. 4,294,283, which is a continuation of Ser. No. 832,896, Feb. 26, 1986, abandoned.

[30] Foreign Application Priority Data

Feb. 28, 1985 [JP] Japan .................. 60-039120

[51] Int. Cl.$^5$ .......................................... H01L 21/331
[52] U.S. Cl. .................................. 437/31; 437/133; 437/184; 437/225; 357/34
[58] Field of Search ............... 437/31, 32, 33, 225, 437/126, 133, 38, 184; 148/DIG. 10, DIG. 11, DIG. 72; 357/34 HB, 34

[56] References Cited

U.S. PATENT DOCUMENTS

| | | | |
|---|---|---|---|
| 4,712,121 | 12/1987 | Yokoyama | 357/34 |
| 4,716,445 | 12/1987 | Sane | 357/34 |
| 4,839,303 | 6/1989 | Tully | 357/34 |
| 4,839,702 | 6/1989 | Grinberg | 357/34 |
| 4,872,040 | 10/1989 | Jackson | 357/34 |

FOREIGN PATENT DOCUMENTS

| | | | |
|---|---|---|---|
| 0177246 | 4/1986 | European Pat. Off. | 357/34 HB |
| 0194197 | 9/1986 | European Pat. Off. | 357/34 HB |
| 0049659 | 3/1987 | Japan | 357/34 HB |

Primary Examiner—Brian E. Hearn
Assistant Examiner—Kevin McAndrews
Attorney, Agent, or Firm—Staas & Halsey

[57] ABSTRACT

A heterojunction bipolar transistor includes a base layer and a wide bandgap emitter layer. A portion of the base layer is exposed, a base electrode is formed thereon and the active region of the emitter-base junction is limited inside a semiconductor body. As a result, surface recombination current generation of the peripheral region of the junction is prevented and the emitter efficiency is improved.

2 Claims, 3 Drawing Sheets

PROCESS FOR FABRICATING A HETEROJUNCTION BIPOLAR TRANSISTOR

This is a divisional of copending application Ser. No. 07/262,241 filed on 10/20/88 now U.S. Pat. No. 4,294,283, which is a continuation of Ser. No. 061832896 filed 02/26/86 now abandoned.

BACKGROUND OF THE INVENTION

1. Field of the Invention

The present invention relates to a heterojunction bipolar transistor, more specifically, it relates to a bipolar transistor with a heterojunction, formed from, for example, gallium arsenide (GaAs) and aluminum gallium arsenide (AlGaAs), in which the emitter efficiency is improved. The present invention also relates to a process for fabricating such a heterojunction bipolar transistor.

2. Description of the Related Art

Recently, heterojunction bipolar transistors have been subjected to intense research and development in order to discover a method for obtaining a higher speed of operation.

For example, a frequency demultiplier comprising GaAs field effect transistors (FET's) or high electron mobility transistors (HEMT's) are operative at cut-off frequencies of up to 4 to 5 GHz. On the other hand, it has been reported that a frequency demultiplier comprising heterojunction bipolar transistors could operate at cut-off frequencies higher than 8 GHz at room temperature. Moreover, a cut-off frequency $F_T$ of more than 40 GHz has been attained by an AlGaAs/GaAs heterojunction bipolar transistor. On the other hand, the cut-off frequency of a silicon transistor is 20 GHz at highest.

An example of an AlGaAs/GaAs heterojunction bipolar transistor in the prior art has the following structure. On a semi-insulating GaAs substrate, an n+-type GaAs collector contact layer, an n-type GaAs collector layer, a p+-type GaAs base layer, an n-type $Al_xGa_{1-x}As$ grading layer (wherein x=0 to 0.3), an n-type $Al_{0.3}Ga_{0.7}As$ emitter layer, and an n+-type GaAs emitter contact layer are consecutively grown. Then a first etching is conducted to form a mesa comprising the emitter contact layer, the emitter layer, and the grading layer, and to expose a portion of the base layer. Beryllium (Be) or magnesium (Mg) ions are implanted into the exposed portion of the base layer, which is then activated by annealing to form a p+-type base contact region therein.

A second etching is conducted to form another mesa comprising the above mesa and the base layer, and to expose a portion of the collector contact layer. On the base contact region, a base electrode is formed. An emitter electrode is formed on top of the mesa (i.e., the emitter contact layer), and a collector electrode is formed on the exposed portion of the collector contact layer. Thus, the main parts of a heterojunction bipolar transistor are constructed.

In this heterojunction bipolar transistor, the forbidden band gap of the AlGaAs emitter layer is larger than that of the GaAs base layer. Therefore, this type of heterojunction bipolar transistor is called "a wide gap emitter bipolar transistor". Essentially, a wide gap emitter bipolar transistor may have a higher emitter efficiency than a homojunction bipolar transistor, since holes (minority carriers for the emitter) flowing from the base to the emitter are blocked by the higher barrier in the valence band.

In practice, however, the emitter efficiency is relatively reduced by a recombination current generated in the emitter-base junction depletion layer. The current gain $h_{FE}$ of the heterojunction bipolar transistor is affected by the recombination current.

Generally, the recombination current depends on the quality of the crystals of the emitter and base layers, and the x value and the thickness of the $Al_xGa_{1-x}As$ grading layer, etc.

Specifically, in the heterojunction bipolar transistor having the structure described above, the emitter-base junction has a region exposed outside the crystal layers, whereat surface states, contamination, damage and the like are easily formed, causing the density of the recombination center to become high, and thus making recombination current generation high.

In the above heterojunction bipolar transistor, it is necessary to etch a portion of the emitter contact layer and the emitter layer to expose a portion of the base layer, to effectively reduce the base resistance. If the above etching is not effected, a base electrode must be formed on the emitter contact layer or on the emitter layer, and the base electrode and the base layer must be electrically connected through a region of the AlGaAs layer by doping a p-type impurity therein. If the base electrode is formed on the AlGaAs layer, the contact resistivity therebetween is relatively high. This is because the barrier height of the metal-AlGaAs junction is higher than that of the metal-AlGaAs junction due to a wider bandgap of AlGaAs. Another reason is that an oxide is easily formed at the surface of the AlGaAs layer, which acts as an insulator between the metal and AlGaAs. If the base electrode is formed on the emitter contact layer by doping a p-type impurity in a region of the emitter region to be converted there to a p-type conductivity in order to prevent the above mentioned effect, electrons and holes will flow through the junction between the n-type and p-type top GaAs regions, which reduces the emitter efficiency. As a result, exposure of the periphery of the interface between the base layer and the emitter layer, or specifically the grading layer, is essential for the structure of the heterojunction bipolar transistor described above, to reduce the base resistance.

SUMMARY OF THE INVENTION

The object of the present invention is to prevent recombination current in the exposed peripheral region of the emitter-base junction of a heterojunction bipolar transistor, whereby the emitter efficiency and the current gain of the transistor are improved.

This and other objects of the present invention are attained by a bipolar transistor comprising: a first semiconductor layer of a first conductivity type; a second semiconductor layer of a second conductivity type opposite to the first conductivity type on the first semiconductor layer; a third semiconductor layer of the first conductivity type on the second semiconductor layer, the third semiconductor layer forming a heterojunction with the second semiconductor layer and being a semiconductor having a bandgap wider than that of the second semiconductor layer, wherein a portion of the second semiconductor layer is not overlaid by the third semiconductor layer; a region of the third semiconductor layer having the second conductivity type along the entire boundary between the third semiconductor layer and the portion of the second semiconductor layer not overlaid by the third semiconductor layer, whereby the periphery of the junction formed by the second semiconductor layer of the first conductivity type and the third semiconductor layer of the second conductivity type is not exposed outside the semiconductor layers; a first electrode electrically connected with the first semiconductor layer; a second electrode above and in contact with the second semiconductor layer; and a third electrode layer above the third semiconductor layer of the first conductivity type.

The region of the third semiconductor layer having the second conductivity type may entirely surround the third semiconductor layer having the first conductivity type, while the former may partially surround the latter and an insulating region may be formed so that the former together with the insulating region entirely surround the latter.

Usually, the third semiconductor layer of the first conductivity type is used as an emitter. However, if the first semiconductor layer of the first conductivity type also forms a heterojunction with the second semiconductor layer of the second conductivity type, and is a semiconductor having a bandgap wider than that of the second semiconductor layer, the first semiconductor layer of the first conductivity type may be used as an emitter. In this case, the transistor is a double-heterojunction bipolar transistor. When the first semiconductor layer is used as an emitter in a double-heterojunction bipolar transistor, the region of the second conductivity type of the third semiconductor layer is useful and serves to prevent reduction of the voltage appearing between the collector and the base, which may be a problem in some cases, particularly when a forward bias is applied therebetween. If the voltage appearing between the collector and the base is reduced, the transistor will easily enter a saturation state. Thus, the high-frequency performance, for example, the switching time of a logic gate, will become longer.

The present invention also relates to a process for fabricating a bipolar transistor comprising the steps of: forming a first semiconductor layer of a first conductivity type; forming a second semiconductor layer of a second conductivity type opposite to the first conductivity type on the first semiconductor layer; forming a third semiconductor layer of the first conductivity type on the second semiconductor layer, the third semiconductor layer being a semiconductor forming a heterojunction with the second semiconductor layer and having a bandgap wider than that of the second semiconductor layer; selectively removing a portion of the third semiconductor layer so that a portion of the second semiconductor layer is exposed and not overlaid by the third semiconductor layer; doping an impurity into a region of the third semiconductor layer extending along the entire boundary between the third semiconductor layer and the exposed portion of the second semiconductor layer to convert the conductivity type of that region into the second conductivity; forming a first electrode electrically connected with the first semiconductor layer; forming a second electrode above and in contact with the second semiconductor layer in the exposed region; and forming a third electrode above the third semiconductor layer.

DESCRIPTION OF THE PREFERRED EMBODIMENTS

Before describing the present invention, a description of the prior art with reference to the drawings will be made to enable an easier understanding of the present invention.

Figure 1:
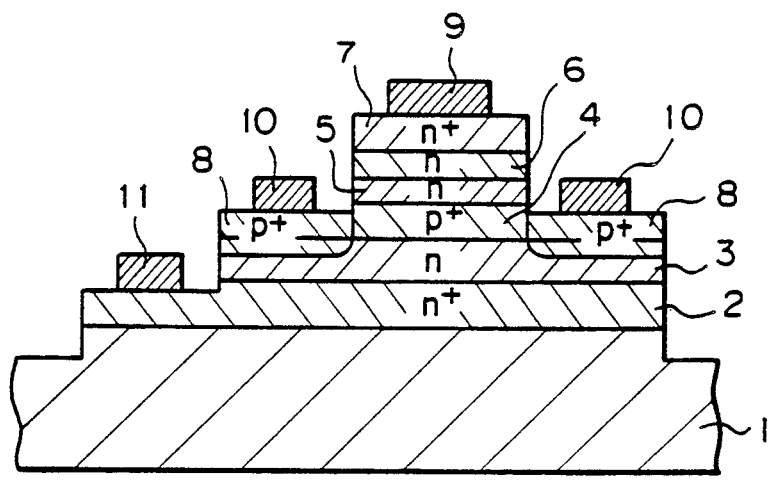
FIG. 1 is a schematic sectional side view of a heterojunction bipolar transistor of the prior art.

FIG. 1 is a schematic sectional side view of a heterojunction bipolar transistor in the prior art, as described before. In FIG. 1, reference numeral 1 denotes a semi-insulating GaAs substrate, 2 an $n^+$-type GaAs collector contact layer, 3 an n-type GaAs collector layer, 4 a $p^+$-type GaAs base layer, 5 an n-type $Al_xGa_{1-x}As$ grading layer, 6 an n-type $Al_{0.3}Ga_{0.7}As$ emitter layer, 7 an $n^+$-type emitter contact layer, 8 a $p^+$-type base contact region, 9 an emitter electrode, 10 a base electrode, and 11 a collector electrode.

As seen in FIG. 1, the top mesa comprises the layers 5 to 7 formed in such a manner that a portion of the base layer 4 is exposed, and the base electrode 10 is formed thereon to reduce the base resistance. On the other hand, because the periphery of the interface between the base layer 4 and the grading layer 5 is exposed outside the semiconductor layers, it is susceptible to surface contamination, damage, etc., which may constitute recombination centers.

Figure 2:
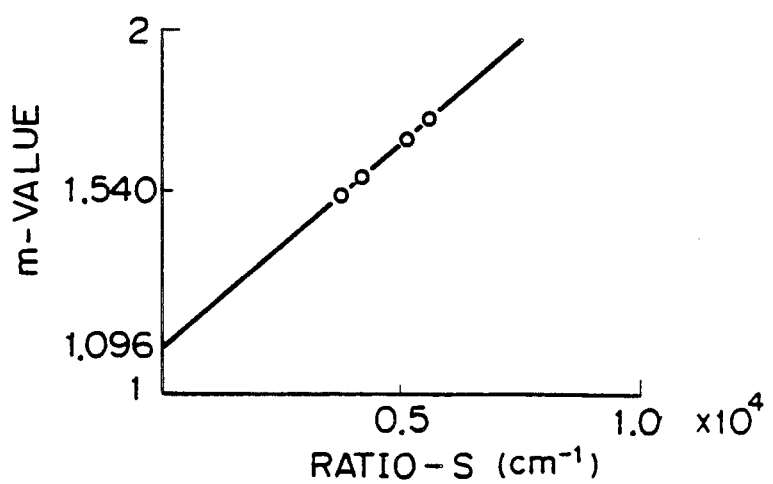
FIG. 2 is a graph of the m value (defined below) in relation to the peripheral length to area ratio S of the emitter-base junction of the heterojunction bipolar transistor in FIG. 1.

To investigate the effects of the exposed periphery on the emitter-base junction, the m value of the heterojunction bipolar transistor in relation to the ratio S of peripheral length to area of the emitter-base junction, of the heterojunction bipolar transistor described before and in FIG. 1, was determined and is shown in FIG. 2. In this case, the carrier concentration of the collector contact layer 2 is $6 \times 10^{18}$ cm$^{-3}$, that of the collector layer 3 is $1 \times 10^{17}$ cm$^{-3}$, that of the base layer 4 is $1 \times 10^{19}$ cm$^{-3}$, that of the grading layer 5 is $5 \times 10^{17}$ cm$^{-3}$, that of the emitter layer 6 is $5 \times 10^{17}$ cm$^{-3}$, and that of the emitter contact layer 7 is $6 \times 10^{18}$ cm$^{-3}$. Note, the m value is an ideal factor defined as follows.

The base current $I_B$ is expressed as the addition of the hole current $I_P$, injected from the base into the emitter, and the surface recombination current $I_S$, in accordance with the following formula:

$$I_B \approx I_P + I_S$$

This may be revised by the following formula, by expressing the respective current components with the emitter-base voltage $V_{BE}$.

$$I_B \approx I_{PO} \exp(qV_{BE}/kT) + I_{SO} \exp(qV_{BE}/kT)$$

where $I_{PO}$ and $I_{SO}$ are, respectively, the hole current $I_P$ and the surface recombination current $I_S$ when the emitter-base voltage $V_{BE}$ is zero, q is the elementary charge, k is the Boltzmann constant, and T is the absolute temperature. If the base current $I_B$ is assumed to be expressed by the following formula:

$$I_B = I_O \exp(qV_{BE}/mkT)$$

where $I_O$ is the base current $I_B$ when the emitter-base voltage $V_{BE}$ is zero, and m is an ideal factor, the m value has a value of between 1 and 2. The nearer the m value is to the value of 2, then the larger is the recombination current component.

FIG. 2 shows that the m value is almost linear to the ratio S. That is, the recombination current is increased as the ratio of the peripheral length to the area of the emitter-base junction becomes larger. This indicates that recombination current generation largely occurs near the exposed periphery of the emitter-base junction.

Figure 3:
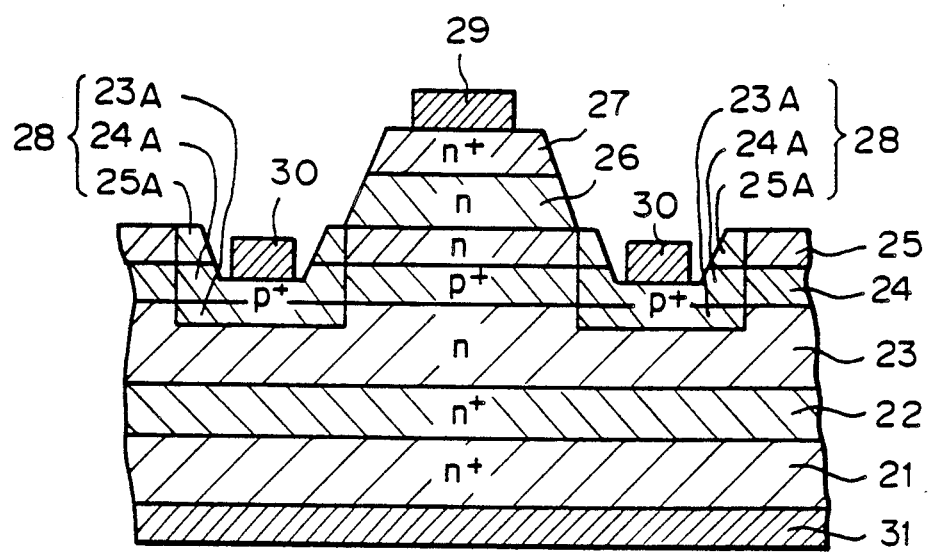
FIG. 3 is a schematic sectional side view of a heterojunction bipolar transistor according to the present invention.

FIG. 3 is a schematic example of a heterojunction bipolar transistor according to the present invention. In FIG. 3, reference numeral 21 denotes an n+-type GaAs substrate with a carrier concentration of $1 \times 10^{18}$ cm$^{-3}$, 22 an n+-type GaAs collector contact layer with a carrier concentration of $2 \times 10^{18}$ cm$^{-3}$ and a thickness of 180 nm, 23 an n-type GaAs collector layer with a carrier concentration of $1 \times 10^{17}$ cm$^{-3}$ and a thickness of 365 nm, 24 a p+-type GaAs base layer with a carrier concentration of $1 \times 10^{19}$ cm$^{-3}$ and a thickness of 100 nm, 25 an n-type $Al_xGa_{1-x}As$ (x=0 to 0.3) grading layer with a carrier concentration of $1 \times 10^{17}$ cm$^{-3}$ and a thickness of 40 nm, where the value x varies gradually from 0 at the boundary to the GaAs layer 24 to 0.3 at the boundary to a $Al_{0.3}Ga_{0.7}As$ layer 26, 26 an n-type $Al_{0.3}Ga_{0.7}As$ emitter layer with a carrier concentration of $1 \times 10^{17}$ cm$^{-3}$ and a thickness of 150 nm, 27 an n+-type GaAs emitter contact layer with a carrier concentration of $2 \times 10^{18}$ cm$^{-3}$ and a thickness of 92 nm, 28 a p+-type doped base contact region, 29 a gold germanium/gold (AuGe/Au) emitter electrode, 30 a gold/zinc/gold (Au/Zn/Au) base electrode, and 31 an AuGe/Au collector electrode. The p+-type base contact region 28 extends all around the n-type AlGaAs grading layer 25.

The critical difference between the device shown in FIG. 3 and the device of FIG. 1 is that the p+-type base contact region 28 extends along the entire peripheral region of the AlGaAs grading layer 25 so that the active region of the emitter-base junction formed between the n-type grading layer 25 and, the p-type base layer 26 is not exposed outside the semiconductor layers in FIG. 3. The active region of the emitter-base junction is square and has a size of 2 $\mu$m $\times$ 5 $\mu$m. Due to a high barrier formed between the p+-type AlGaAs region 25A and the body of the n-type AlGaAs grading layer 25, carriers or electrons do not enter the p+-type AlGaAs region 25 where many recombination centers are present, whereby recombination current generation is prevented and an improved emitter efficiency and thus current gain are attained.

Figure 4:
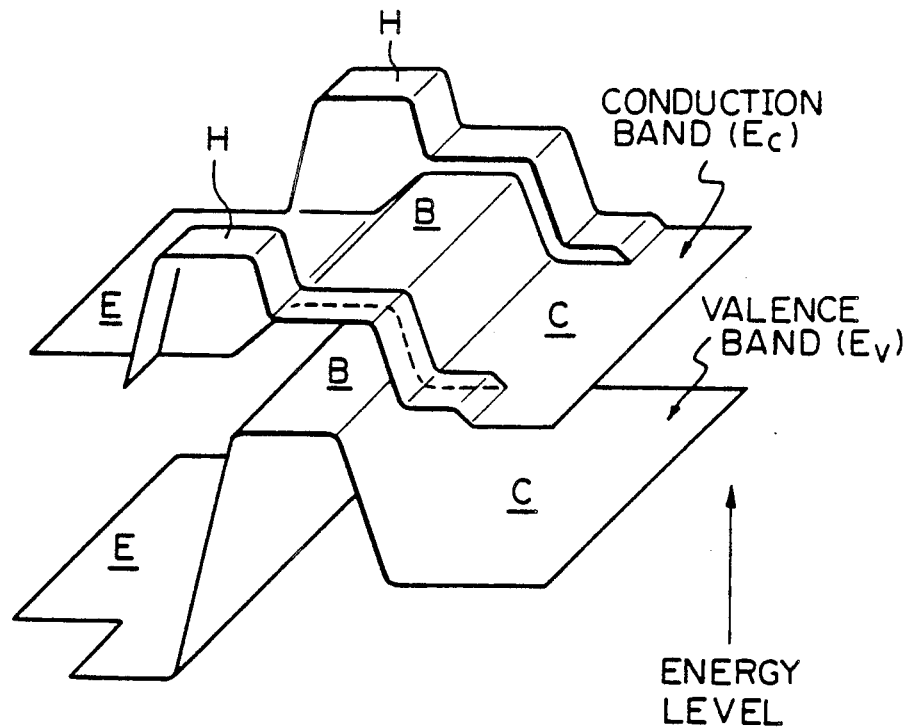
FIG. 4 is a band diagram of the heterojunction bipolar transistor of FIG. 3.

FIG. 4 is a schematic band diagram of the heterojunction bipolar transistor of FIG. 3 in the section of the drawing of FIG. 3. In FIG. 4, the upper sheet expresses the conduction band $E_C$, the lower sheet the valence band $E_V$, and the reference signs E denote an emitter region, B a base region, and C a collector region. As seen in FIG. 4, the bandgap of the emitter region is wide due to the heterojunction between the AlGaAs and GaAs. The hills or high barriers H at both sides of the base region B and a part of the collector region C, in the conduction band, correspond to a part of the p+-type base contact region 28, and the highest hills or barriers correspond to the p+-type AlGaAs region 25A. Such high hills in the conduction band are formed due to a wide bandgap of the AlGaAs.

The emitter current flows mainly through the inside portion of the emitter (more specifically, grading) and base layers (this portion can be deemed to be an active portion) due to the high energy hills or barriers at both sides thereof. As a result, recombination current generation at the exposed peripheral regions of the interface between the emitter (or grading) and base layers is prevented, since electrons capable of generating recombination current can enter those peripheral regions only with difficulty. Thus, a high emitter efficiency and, as a result, a high current gain $h_{FE}$ are attained in the heterojunction bipolar transistor as shown in FIG. 3.

Figure 5:
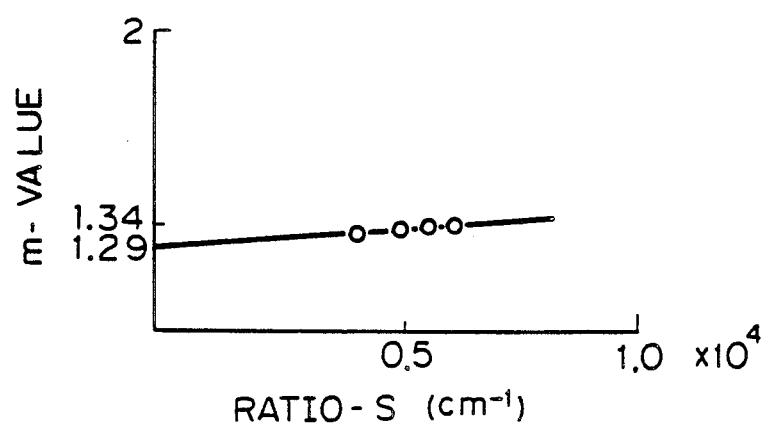
FIG. 5 is a graph of the m value in relation to the ratio S of the heterojunction bipolar transistor of FIG. 3.

FIG. 5 shows the m value in relation to the ratio S of peripheral length to area of the emitter-base junction of the heterojunction bipolar transistor shown in FIG. 3. In FIG. 5, it can be seen that, in this case, the m value depends little upon the ratio S. Thus, it is deemed that the surface recombination current generation or the bad effects from the exposed peripheral region comprising surface states, contamination, damage, etc., are almost eliminated in a heterojunction bipolar transistor according to the present invention.

Fabrication of the main parts of the heterojunction bipolar transistor in FIG. 3 may be carried out as follows: On the substrate 21, the collector contact layer 22, the collector layer 23, the base layer 24, the grading layer 25, the emitter layer 26, and the emitter contact layer 27 are consecutively grown. First etching is carried out to form a mesa comprising at least the emitter contact layer 27, typically comprising the emitter contact layer 27 and the emitter layer 26, and to expose a portion of the grading layer 25 on the emitter layer 26. In the first etching, at least the GaAs emitter contact layer 27 should be removed in the etching portion in order to prevent the formation, by later implantation, of a junction between n+-type and p$^{30}$-type GaAs regions through which carriers are able to relatively easily flow and cause surface recombination current generation and reduction of the emitter efficiency. Into a region of the exposed portion of the base layer 24, where the base electrode 30 is to be formed, Be or Mg ions are implanted at 40 keV in case of Be ions and 120 keV in case of Mg, and at a dosage of $1 \times 10^{16}$ cm$^{-2}$, followed by annealing at 700° C. for 20 minutes for activation, to form the p+-type base contact region 28 comprising a p+-type AlGaAs region 25A, a p+-type GaAs region 24A, and a p$^{30}$-type GaAs region 23A. Second etching is carried out to remove a portion of the p+-type AlGaAs region 25A and to expose a portion of the p+-type GaAs region 24A under the removed portion of the p+- type AlGaAs region 25A. In the second etching, the p+-type GaAs region 24A may be removed in a partial thickness thereof but the p+-type GaAs region 24A should not be removed in the entire thickness thereof, since the base electrode 30 must be formed on the exposed region of the base layer. To form the base electrode 30, titanium, platinum, and gold (Ti/Pt/Au) are deposited on the exposed portion of the p+- type GaAs region 23A and patterned. The emitter electrode 29 is formed on top of the mesa or on the emitter contact layer 27, and the collector electrode 31 is formed on the bottom side of the substrate 21. These electrodes 29 and 31 are of AuGe/Au.

Figure 6:
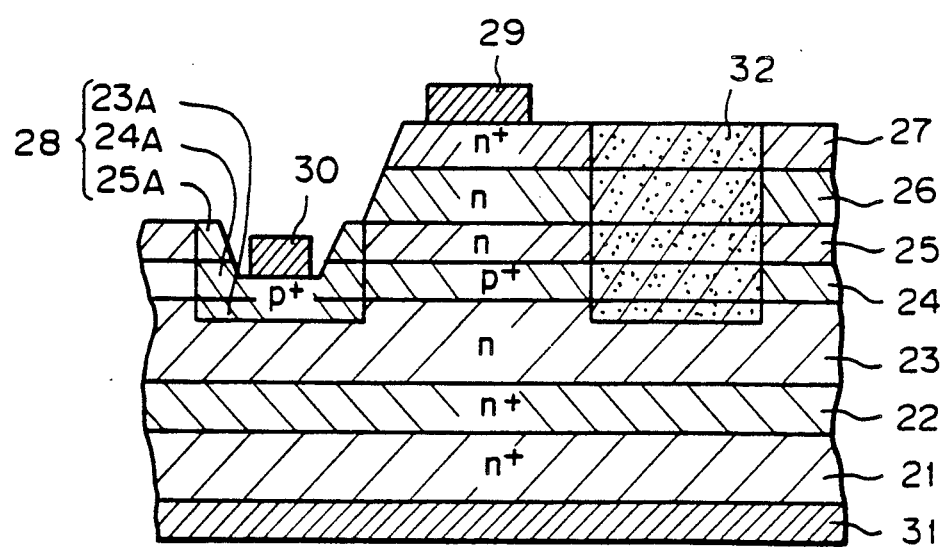
FIG. 6 is a schematic sectional side view of another heterojunction bipolar transistor according to the present invention.

FIG. 6 illustrates another embodiment of the present invention. In FIG. 6, parts corresponding to those in FIG. 3 are denoted by the same reference numerals as in FIG. 3. This heterojunction bipolar transistor is similar to that shown in FIG. 3, but the exposed portion of the base layer does not entirely surround the active region of the base layer. Alternatively, there is an insulating region 32 across at least the base layer 24 and the grading layer 25. The insulating region 32 and the p+-type doped region 28 are formed so as to correspond to the exposed portion of the base layer, and to entirely surround the active regions of the base layer 24 and the grading layer 25. As a result, the junction between the p+-type base layer 24 and the n-type region of the grading layer 25 is not exposed outside the semiconductor layers. In the insulating region 32, recombination current generation cannot occur since electrons or holes capable of generating recombination current do not enter therein. Therefore, surface recombination current generation in the emitter-base junction depletion layer is also prevented in the heterojunction bipolar transistor in FIG. 6.

The insulating region 32 may be formed, for example, by implanting oxygen ($O_2$) ions therein.

I claim:

1. A process for fabricating a bipolar transistor comprising the steps of:
   (a) forming a first semiconductor layer of a first conductivity type;
   (b) forming a second semiconductor layer of a second conductivity type, opposite to the first conductivity type, on the first semiconductor layer;
   (c) forming a third semiconductor layer of the first conductivity type on the second semiconductor layer, the third semiconductor layer comprising a semiconductor forming a heterojunction with the second semiconductor layer and having a bandgap wider than that of the second semiconductor layer;
   (d) selectively removing a portion of the third semiconductor layer so that a portion of the second semiconductor layer is exposed and out overlaid by the third semiconductor layer;
   (e) doping an impurity into a region of the third semiconductor layer extending along an entire boundary between the third semiconductor layer and the exposed portion of the second semiconductor layer to convert the conductivity type of that region into the second conductivity;
   (f) forming a first electrode electrically connected with the first semiconductor layer;
   (g) forming a second electrode above and in contact with the second semiconductor layer in the exposed region; and
   (h) forming a third electrode above the third semiconductor layer.

2. A process according to claim 1, further comprising the step of forming insulating portions in the third and second semiconductor layers, so that an active region of the boundary between the third semiconductor layer and the second semiconductor layer is entirely surrounded by the insulating portions and the doped region.

* * * * *

UNITED STATES PATENT AND TRADEMARK OFFICE
CERTIFICATE OF CORRECTION

PATENT NO. : 4,996,166
DATED : FEBRUARY 26, 1991
INVENTOR(S) : TOSHIO OHSHIMA

It is certified that error appears in the above-identified patent and that said Letters Patent is hereby corrected as shown below:

TITLE PAGE [60], line 2, "4,294,283" should be --4,924,283--.

Col. 1, line 7, "4,294,283" should be --4,924,283--.

Signed and Sealed this

Twenty-fifth Day of August, 1992

*Attest:*

DOUGLAS B. COMER

*Attesting Officer*  Acting Commissioner of Patents and Trademarks